(12) United States Patent
Lai et al.

(10) Patent No.: US 8,634,039 B2
(45) Date of Patent: Jan. 21, 2014

(54) DISPLAY DEVICE

(75) Inventors: Yi-Hsiang Lai, Hsinchu (TW); Yi-Nan Lin, Taoyuan County (TW); Chih-Chung Chao, Hsinchu County (TW); Chi-Chung Lo, Changhua Conty (TW)

(73) Assignee: Au Optronics Corporation, Hsinchu (TW)

( * ) Notice: Subject to any disclaimer, the term of this patent is extended or adjusted under 35 U.S.C. 154(b) by 193 days.

(21) Appl. No.: 13/103,115

(22) Filed: May 9, 2011

(65) Prior Publication Data

US 2012/0162563 A1 Jun. 28, 2012

(30) Foreign Application Priority Data

Dec. 28, 2010 (TW) .............................. 99146376 A

(51) Int. Cl.
*G02F 1/1333* (2006.01)
*G02F 1/1335* (2006.01)
*G06F 3/041* (2006.01)

(52) U.S. Cl.
USPC ........... 349/58; 349/12; 361/679.24; 345/173

(58) Field of Classification Search
USPC .................. 349/12, 58; 345/173; 361/679.24
See application file for complete search history.

(56) References Cited

U.S. PATENT DOCUMENTS

| 2009/0079894 A1* | 3/2009 | Okuda ............................ 349/58 |
| 2009/0086123 A1* | 4/2009 | Tsuji et al. ...................... 349/58 |
| 2009/0153768 A1* | 6/2009 | Ooami ............................. 349/58 |

FOREIGN PATENT DOCUMENTS

| CN | 1731251 | 2/2006 |
| CN | 201159809 | 12/2008 |
| TW | I276893 | 3/2007 |
| TW | I319825 | 1/2010 |

OTHER PUBLICATIONS

"First Office Action of China Counterpart Application", issued on Jan. 29, 2012, p. 1-p. 6, in which the listed references were cited.

* cited by examiner

*Primary Examiner* — Nathanael R Briggs
(74) *Attorney, Agent, or Firm* — Jianq Chyun IP Office

(57) ABSTRACT

A display device includes a display module, a cover plate, and a light shielding film. The display module includes a display panel. The display panel has a black matrix pattern that surrounds a display area. The cover plate is configured on the display module. The light shielding film is adhered to at least one of the display module and the cover plate and located between the display module and the cover plate. The light shielding film is substantially located outside the display area, and an inter-medium is configured between the light shielding film and the cover plate and between the display module and the cover plate.

13 Claims, 6 Drawing Sheets

DISPLAY DEVICE

CROSS-REFERENCE TO RELATED APPLICATION

This application claims the priority benefit of Taiwan application serial no. 99146376, filed Dec. 28, 2010. The entirety of the above-mentioned patent application is hereby incorporated by reference herein and made a part of this specification.

BACKGROUND

1. Technical Field

The invention relates to a display device. More particularly, the invention relates to a display device that can prevent peripheral light leakage and have favorable display quality.

2. Description of Related Art

The appearances of liquid crystal display (LCD) devices are required to be stylish, light, compact, and easy to carry. In terms of performance, the LCD devices are required to be characterized by high contrast ratio, no gray scale inversion, low color shift, high luminance, high color richness, high color saturation, fast responsive speed, and wide viewing angles. At this current stage, displays such as twisted nematic (TN) LCD displays equipped with wide viewing films, in-plane switching (IPS) LCD displays, fringe field switching (FFS) LCD displays, and multi-domain vertical alignment (MVA) LCD displays have been developed to satisfy the requirement for wide viewing angles.

In the LCD devices that can achieve the wide-viewing-angle display effects, the LCD panels equipped with the wide-viewing-angle display functions can meet users' requirement for viewing the display images at different viewing angles. However, in most cases, the display devices are fully integrated if the LCD panels are assembled to backlight units and cover glass that protects the entire display device. When the LCD panels, the backlight units, and the cover glass are integrated, these assembled components cannot be closely adhered to one another, such that light leakage may occur at the peripheries of the display devices when the users view the display images at the large viewing angles. Due to the peripheral light leakage, the display quality of the display devices is not in general satisfactory. Moreover, the adhesive employed in the assembling process may lead to air bubble issues, which also deteriorates the display quality of the display devices.

SUMMARY

The invention is directed to a display device that can achieve favorable display effects and is not apt to have peripheral light leakage.

The invention is further directed to a display device that can resolve air bubble issues caused by the peripheral adhesive during an assembling process.

In an embodiment of the invention, a display device that includes a display module, a cover plate, and a light shielding film is provided. The display module includes a display panel. The display panel has a black matrix pattern that surrounds a display area. The cover plate is configured on the display module. The light shielding film is adhered to at least one of the display module and the cover plate and located between the display module and the cover plate. Besides, the light shielding film is substantially located outside the display area, and an inter-medium is configured between the light shielding film and the cover plate and between the display module and the cover plate.

In an embodiment of the invention, another display device that includes a display module, a cover plate, a light shielding film, and an optical adhesive is provided. The display module includes a display panel. The display panel has a black matrix pattern that surrounds a display area. The cover plate is configured on the display module. The light shielding film is configured between the cover plate and the display module and substantially located outside the display area. The optical adhesive is at least distributed at one side of the light shielding film adjacent to the cover plate to fix the light shielding film to the cover plate.

In an embodiment of the invention, another display device that includes a display module, a cover plate, and a light shielding film is provided. The display module includes a display panel. The display panel has a black matrix pattern that surrounds a display area. The cover plate is configured on the display module. The light shielding film is in contact with the cover plate and located between the cover plate and the display module. Besides, the light shielding film is substantially located outside the display area.

Based on the above, the light shielding film is configured between the display module and the cover plate and located outside the display area defined by the display panel of the display module. Thereby, peripheral light leakage that possibly occurs in the display device can be prevented by the light shielding film, so as to ensure the favorable display quality of the display device. Moreover, the inter-medium between the light shielding film and the cover plate and the inter-medium between the light shielding film and the cover plate are made of the same material (e.g., air or an optical adhesive) and are communicated. Hence, air bubbles are not apt to be generated between the light shielding film and the cover plate, so as to ensure the favorable display quality of the display device.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
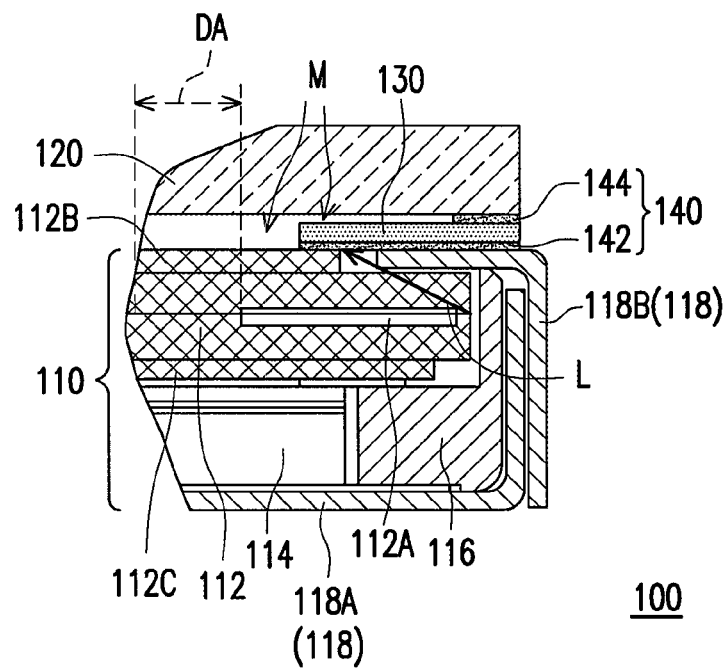
FIG. 1 is a schematic view illustrating a display device according to a first embodiment of the invention.

FIG. 1 is a schematic view illustrating a display device according to a first embodiment of the invention. With reference to FIG. 1, a display device 100 includes a display module 110, a cover plate 120, and a light shielding film 130. The display module 110 includes a display panel 112. The display panel 112 has a black matrix pattern 112A, and the black matrix pattern 112A substantially surrounds the periphery of the display panel 112, so as to define a display area DA. The cover plate 120 is configured on the display module 110. The light shielding film 130 is adhered to the display module 110 and the cover plate 120 and located between the display module 110 and the cover plate 120. Besides, the light shielding film 130 is substantially located outside the display area DA, and the same inter-medium M is configured between the light shielding film 130 and the cover plate 120 and between the display module 110 and the cover plate 120. The cover plate 120 can be a glass board, a polymer board, or a touch-sensing panel.

Specifically, the display module 110 in the display device 100 not only has the display panel 112 but also includes a backlight unit 114, a first frame 116, and a second frame 118. The backlight unit 114 is located at one side of the display panel 112 away from the cover plate 120. The display panel 112 and the backlight unit 114 are assembled together by the first frame 116. The first frame 116, the display panel 112 contained in the first frame 116, and the backlight unit 114 contained in the first frame 116 are configured in the second frame 118.

The display panel 112 is a non-self-illuminating LCD panel, for instance, and the backlight unit 114 can provide the display light source required by the display module 110. Hence, the display panel 112 can further has an upper polarizer 112B and a lower polarizer 112C, which should not be construed as a limitation to the invention. Given the display panel 112 is a self-illuminating display panel (e.g., an organic electro-luminescence display panel) or a reflective display panel (e.g., an electro-wetting display panel, an electrophoresis display panel, etc.), the upper polarizer 112B, the lower polarizer 112C, the backlight unit 114, and the first frame 116 can be omitted in the display module 110.

The second frame 118 can include a lower frame 118A and an upper frame 118B. The upper and lower frames 118B and 118A are locked to each other, so as to accommodate the display panel 112 and the backlight unit 114. The light shielding film 130 is fixed to the display module 110 and the upper frame 118B by an adhesive 142 and another adhesive 144 of an adhesion structure 140. According to this embodiment, the first frame 116 can be a plastic frame, while the second frame 118 can be a metal frame, which should not be construed as a limitation to the invention.

When images are displayed on the display device 100, the backlight unit 114 can emit light for image display. Nonetheless, the angle at which the light of the backlight unit 114 is emitted remains variable, and the display panel 112 and the second frame 118 are not completely sealed. Parts of the light, e.g., a leak light L, may be emitted from the edge of the black matrix pattern 112A, which leads to peripheral light leakage. Hence, the light shielding film 130 is configured between the display module 110 and the cover plate 120 in this embodiment, so as to effectively block the leak light L and prevent users from observing the leak light L when the users view the images displayed on the display device 100 at large viewing angles.

Note that the area occupied by the light shielding film 130 should be large enough to block the leak light L but cannot cover the display area DA. Accordingly, the area occupied by the light shielding film 130 is designed in different ways when the light shielding film 130 is applied in the display devices 100 with different dimensions. The area occupied by the light shielding film 130 is at most aligned to the inner edge of the black matrix pattern 112A of the display panel 112. Namely, the width of the light shielding film 130 can extend from the outer edge of the display device 100 to the edge of the display area DA, and the light shielding film 130 and the black matrix pattern 112A are overlapped in a vertical projection direction perpendicular to the surface of the display panel 110. By contrast, the area occupied by the light shielding film 130 at least reaches the position irradiated by the leak light L on the upper surface of the display module 110. Certainly, the angle at which the leak light L is emitted can be changed according to the design of different devices. In addition, the light shielding film 130 needs to occupy a relatively large area if the devices using the light shielding film 130 are required to achieve the wide-viewing-angle display effects. On the contrary, the light shielding film 130 can have a relatively small area if the devices using the light shielding film 130 are not required to achieve the wide-viewing-angle display effects.

In this embodiment, the light shielding film 130 can be made of an opaque thin film material that includes polyethylene terephthalate (PET). The light shielding film 130 is substantially adhered between the display module 110 and the cover plate 120 by the adhesion structure 140 including the adhesive 142 and the adhesive 144. The adhesive 142 is located between the light shielding film 130 and the display module 110, and the adhesive 144 is located between the cover plate 120 and the light shielding film 130. In detail, if the adhesive 144 is completely coated onto the light shielding film 130, air bubbles may be formed in the adhesive 144 due to the incontrollable process of assembling the display device 100. When the users view the images displayed on the display device 100 at large viewing angles, the users are likely to observe the light refracted by the air bubbles at the periphery of the display images. Therefore, even though the leak light L can be effectively blocked by the light shielding film 130, the display quality of the display device 100 is barely satisfactory.

The adhesive 144 of this embodiment is substantially distributed in partial regions of the light shielding film 130, and the light shielding film 130 is partially exposed. That is to say, the adhesive 144 is preferably configured close to or along the periphery of the cover plate 120. Particularly, the adhesive 144 is configured at one side of the light shielding film 130 away from the display area DA, such that the area of the adhesive 144 is not equal to the area of the light shielding film 130, and that the adhesive 142 and the adhesive 144 are asymmetrically distributed on two opposite surfaces of the light shielding film 130. The inter-medium M fills the space between the cover plate 120 and a portion of the light shielding film 130 exposed by the adhesion structure 140, and the inter-medium M is air, for instance. Here, the inter-medium M between the display panel 112 and the cover plate 120 and the inter-medium M between the light shielding film 130 and the cover plate 120 are communicated. Thereby, the area occupied by the adhesive 144 is reduced, and the area occupied by the inter-medium M is expanded. Since no air bubble is formed in the inter-medium M, the display quality of the display device 100 can be improved.

Figure 2:
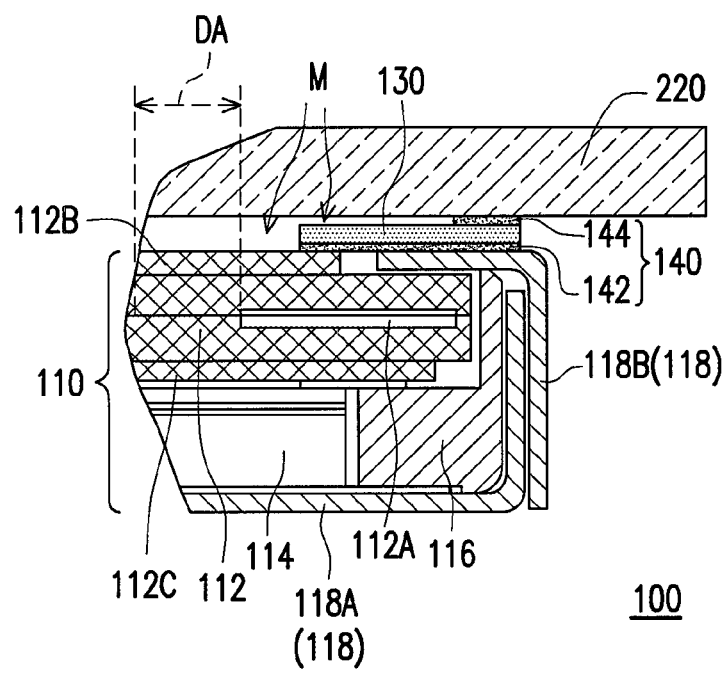
FIG. 2 is a schematic view illustrating a display device according to a second embodiment of the invention.

FIG. 2 is a schematic view illustrating a display device according to a second embodiment of the invention. With reference to FIG. 2, the display device 200 is similar to the display device 100 of the first embodiment, while the area of the cover plate 220 is greater than the area of the display module 110 in the display device 200. Hence, the display device 200 has a relative large cover plate 220 which can be assembled to specially-designed electronic products.

Figure 3:
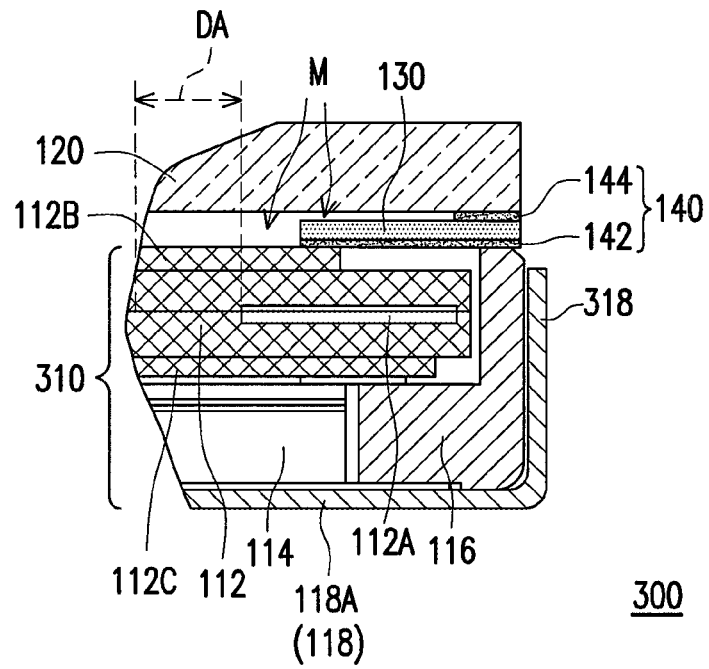
FIG. 3 is a schematic view illustrating a display device according to a third embodiment of the invention.

FIG. 3 is a schematic view illustrating a display device according to a third embodiment of the invention. With reference to FIG. 3, the display device 300 is similar to the display device 100 of the first embodiment, while the second frame 318 merely includes one lower frame in the display module 310 of the display device 300. In other words, the upper frame 118B of the display device 100 is omitted in the display device 300 according to the third embodiment of the invention. The adhesive 142 of the adhesion structure 140 is directly adhered to the first frame 116 and the display panel 112, and the first frame 116 is a plastic frame, for instance.

Figure 4:
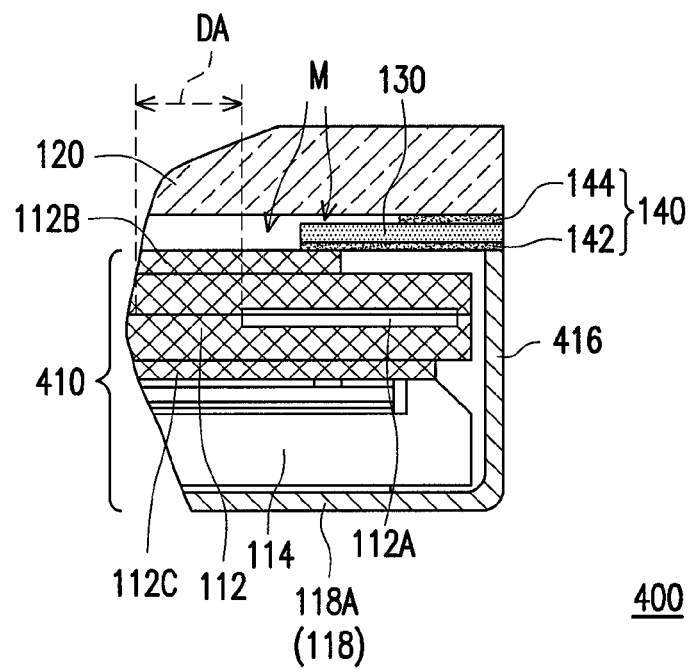
FIG. 4 is a schematic view illustrating a display device according to a fourth embodiment of the invention.

FIG. 4 is a schematic view illustrating a display device according to a fourth embodiment of the invention. With reference to FIG. 4, the display device 400 is similar to the display device 300 of the third embodiment, while the first frame 116 of the display device 300 is omitted in the display module 410 of the display device 400. Namely, the display panel 112 and the backlight unit 114 are assembled by one frame 416 in the display module 410 of this embodiment. Here, the adhesive 142 of the adhesion structure 140 is adhered to the frame 416 and the display panel 112, for instance. In the embodiment of the FIG. 3 and FIG. 4, the display device 300 not only has favorable display quality but also has advantages of slim border, low cost, reduced weight, and easy assembly.

The assembly configurations of the display modules 110, 310, and 410 are not limited in the invention, as described in the embodiments as shown in FIG. 1 to FIG. 4. As long as the light shielding film 130 is configured between the display modules 110, 310, and 410 and the cover plates 120 and 220, and no air bubble exists in the inter-medium M filling the space between the light shielding film 130 and the cover plates 120 and 220, the technical proposal mentioned herein does not depart from the scope of the invention. Namely, as described in the previous embodiments of the invention, the leak light L can be blocked by the light shielding film 130, and the negative impact on the display effects due to the air bubbles can be reduced by the light shielding film 130. Any of the display modules 110, 310, and 410 is applicable in the following embodiments, and the display module 110 is exemplified below to describe the invention.

Figure 5:
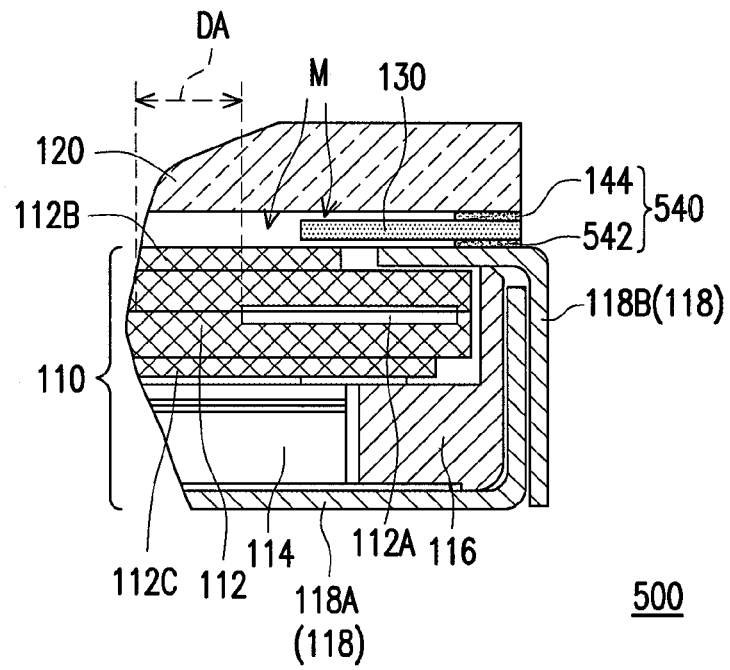
FIG. 5 is a schematic view illustrating a display device according to a fifth embodiment of the invention.

FIG. 5 is a schematic view illustrating a display device according to a fifth embodiment of the invention. With reference to FIG. 5, the display device 500 is similar to the display device 100 of the first embodiment, while the adhesion structure 540 in the display device 500 includes the adhesive 144 and an adhesive 542. The adhesive 542 is distributed on a portion of the light shielding film 130. In this embodiment, the adhesion structure 540 is employed to fix the light shielding film 130 between the display module 110 and the cover plate 120. Hence, as long as the adhesion structure 540 can fix the light shielding film 130, it falls within the scope of the invention, and the area occupied by the adhesion structure 540 need not be restricted in the invention. In this embodiment, the adhesive 144 is configured on a portion of the light shielding film 130, preferably close to or along the periphery of the cover plate 120 (i.e., away from the display area DA), such that the area of the adhesive 144 is not equal to the area of the light shielding film 130.

Figure 6:
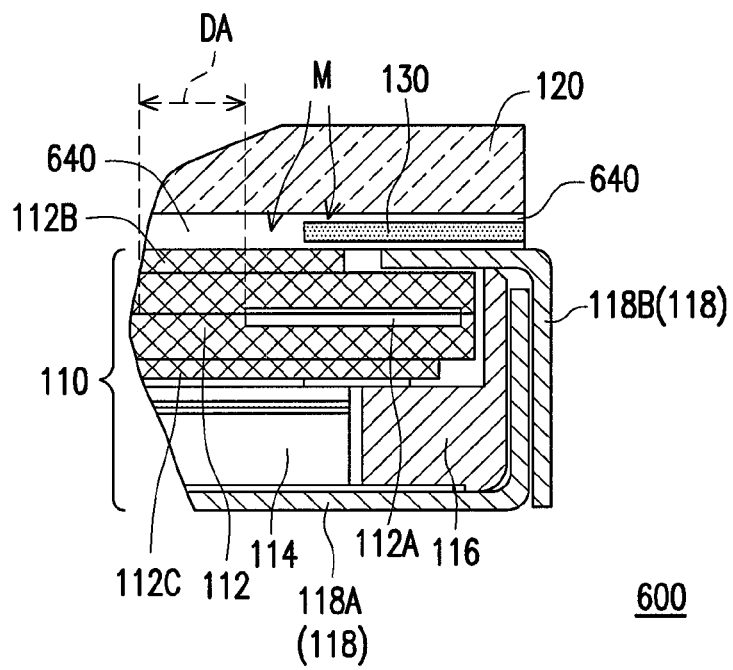
FIG. 6 is a schematic view illustrating a display device according to a sixth embodiment of the invention.

FIG. 6 is a schematic view illustrating a display device according to a sixth embodiment of the invention. With reference to FIG. 6, the display device 600 includes a display module 110, a cover plate 120, a light shielding film 130, and an optical adhesive 640. Here, the display module 110 can be the same as the display device 110 of the first embodiment, for instance, while the display module 110 of this embodiment can also refer to the display module 310 or the display module 410. In this embodiment, the display module 110 and the cover plate 120 are adhered to each other by the optical adhesive 640, for instance. The light shielding film 130 is configured in the optical adhesive 640, i.e., the light shielding film 130 can be fixed to the cover plate 120 and the display module 110 by the optical adhesive 640. Meanwhile, the cover plate 120 and the display module 110 are fixed to each other by the optical adhesive 640 as well. The inter-medium M configured between the cover plate 120 and the display module 110 and between the cover plate 120 and the light shielding film 130 is the optical adhesive 640 in this embodiment.

Note that the optical adhesive 640 is flowable and has low viscosity; therefore, air bubbles are not apt to be formed when the optical adhesive 640 is adhered to the display module 110 and the cover plate 120, and the display quality is not negatively affected. In this embodiment, the space between the light shielding film 130 and the cover plate 120 and the space between the light shielding film 130 and the display module 110 can be fully filled with the optical adhesive 640. The optical adhesive 640 not only has adhesion effects but is not apt to generate the air bubbles, such that the display device 600 can have favorable display quality.

In this embodiment, the inter-medium M between the light shielding film 130 and the cover plate 120 and between the display module 110 and the cover plate 120 is the optical adhesive 640. Owing to the same inter-medium M, no boundary between different areas is observed when the users view the images displayed on the display device 600 at oblique angles. Accordingly, even though the display device 600 is equipped with the light shielding film 130, the overall display quality or the appearance of the display device 600 is not negatively affected.

Figure 7:
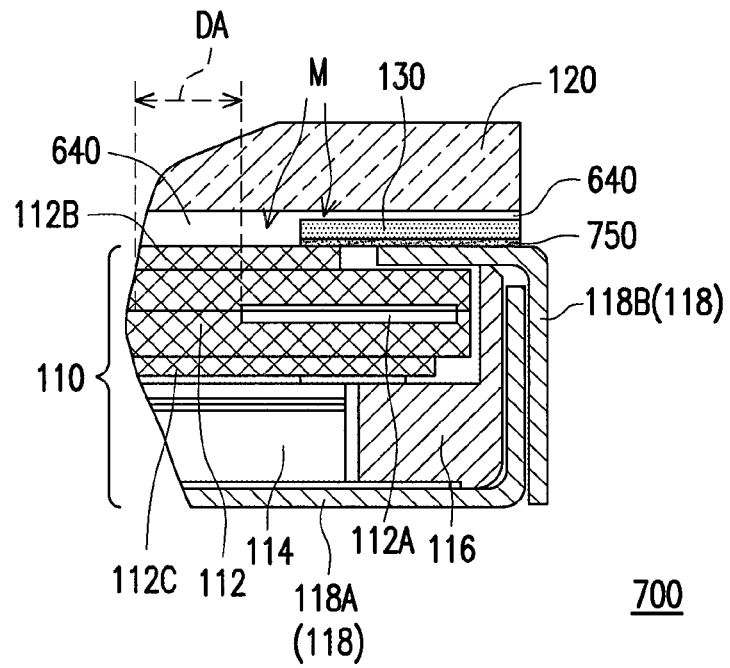
FIG. 7 is a schematic view illustrating a display device according to a seventh embodiment of the invention.

FIG. 7 is a schematic view illustrating a display device according to a seventh embodiment of the invention. With reference to FIG. 7, the difference between the display devices 700 and 600 lies in that the light shielding film 130 is fixed to the display module 110 by an adhesive 750 in the display device 700. In this embodiment, the adhesive 750 is configured between the display module 110 and the light shielding film 130. During the assembling process, it is preferable to fix the light shielding film 130 to the display module 110 by the adhesive 750, and the cover plate 120 and the display module 110 are fixed to each other by the optical adhesive 640. However, it is not necessary to fix the light shielding film 130 to the display module 110 by the optical adhesive 640 in the invention. The light shielding film 130 can also be fixed to the display module 110 by the adhesive 750. Certainly, the light shielding film 130 can be fully or partially coated with the adhesive 750.

Figure 8:
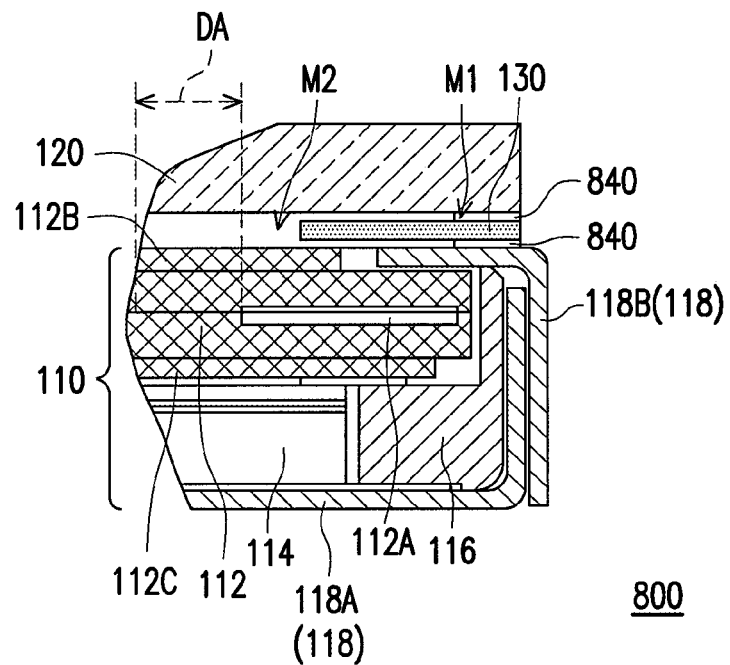
FIG. 8 is a schematic view illustrating a display device according to an eighth embodiment of the invention.
Figure 9:
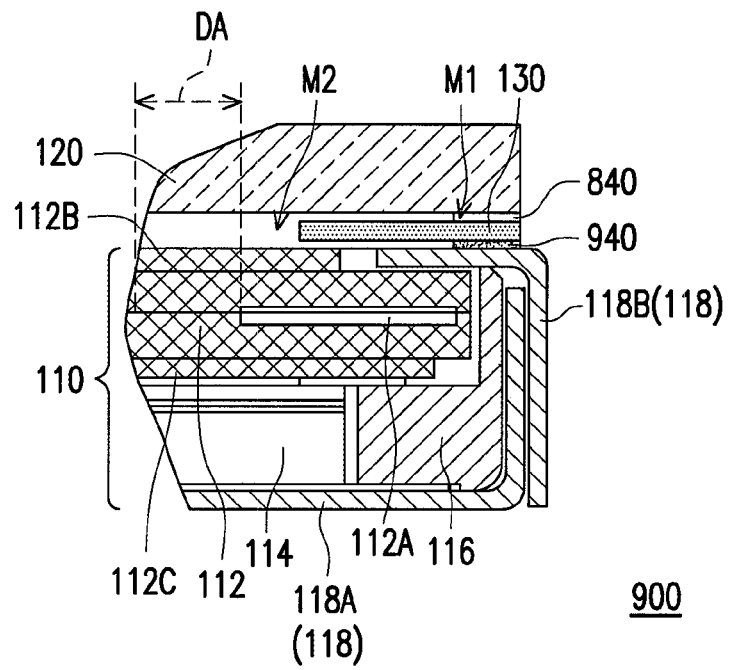
FIG. 9 is a schematic view illustrating a display device according to a ninth embodiment of the invention.

FIG. 8 is a schematic view illustrating a display device according to an eighth embodiment of the invention. With reference to FIG. 8, the display device 800 is similar to the display device 600 of the sixth embodiment, while the area occupied by the optical adhesive 840 is different from that occupied by the optical adhesive 640. Specifically, the optical adhesive 840 of this embodiment is employed to fix the light shielding film 130. Hence, the optical adhesive 840 is configured between the light shielding film 130 and the cover plate 120 and between the light shielding film 130 and the display module 110. In other words, the inter-medium M1 between the light shielding film 130 and the cover plate 120 is the optical adhesive 840, and the inter-medium M2 between the display module 110 and the cover plate 120 and between the light shielding film 130 and the cover plate 120 can be air. The optical adhesive 840 is flowable, and thus air bubbles are not apt to be formed during the assembling process. Namely, the air bubbles are less likely to be generated under the cover plate 120 when the light shielding film 130 and the cover plate 120 are fixed by the optical adhesive 840. Thereby, both the light leakage and the air bubbles can be reduced, and the display quality of the display device 800 can be improved. It is not limited to configure the optical adhesive 840 as a whole between the display module 110 and the cover plate 120 in this invention. According to another embodiment of the invention, as shown in FIG. 9, the light shielding film 130 can be fixed to the display module 110 of the display device 900 by the adhesive 940. The way to fix the light shielding film 130 to the display module 110 is not limited in the invention. Namely, the light shielding film 130 can be adhered to the display module 110 by the adhesive 940 or the optical adhesive, and the light shielding film 130 can be fully or partially coated with the adhesive 940 or the optical adhesive.

In the embodiments depicted in FIG. 8 and FIG. 9, the optical adhesive 840 is preferably configured close to or along the periphery of the cover plate 120. Owing to the same inter-medium (M2 is air), the users are rather unlikely to observe the boundary between different areas when the users view the images displayed on the display device 800 or 900 at oblique angles. The optical adhesive 840 is flowable, and thus the air bubbles are not apt to be formed. Accordingly, when the cover plate 120 and the light shielding film 130 are fixed by the optical adhesive 840, where the optical adhesive 840 is configured between the cover plate 120 and the light shielding film 130 is not limited in the invention, e.g., the light shielding film 130 can be completely coated with the optical adhesive 840, or the optical adhesive 840 can be distributed on a portion of the light shielding film 130 along or close to the display area DA, so as to improve the display quality.

Figure 10:
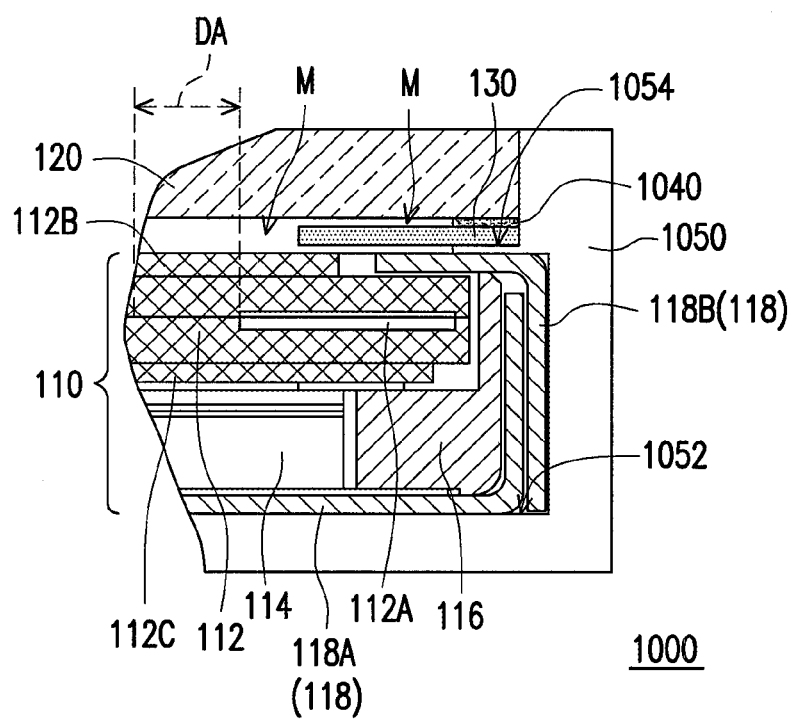
FIG. 10 is a schematic view illustrating a display device according to a tenth embodiment of the invention.

FIG. 10 is a schematic view illustrating a display device according to a tenth embodiment of the invention. With reference to FIG. 10, the display device 1000 of this embodiment not only has the components of the display device 100 described in the first embodiment but also includes a housing 1050. Besides, the light shielding film 130 is fixed to the cover plate 120 by the adhesive 1040 in this embodiment. Namely, the light shielding film 130 is fixed between the cover plate 120 and the housing 1050.

Specifically, the housing 1050 has a first accommodation part 1052 and a second accommodation part 1054. The display module 110 is placed in the first accommodation part 1052, and the cover plate 120 is placed on the second accommodation part 1054. The light shielding film 130 of this embodiment is fixed to the cover plate 120 by the adhesive 1040 and carried by the second accommodation part 1054. Therefore, the inter-medium M between the cover plate 120 and the light shielding film 130 and the inter-medium M between the cover plate 120 and the display module 110 are the same and are air, for instance. In this embodiment, the adhesive 1040 is configured on the light shielding film 130 close to or along the outer edge of the cover plate 120, and thus the area occupied by the adhesive 1040 is reduced. Consequently, the light shielding effects can be improved, the air bubbles are less likely to be formed under the cover plate 120, and the display quality of the display device 1000 can be improved.

Figure 11:
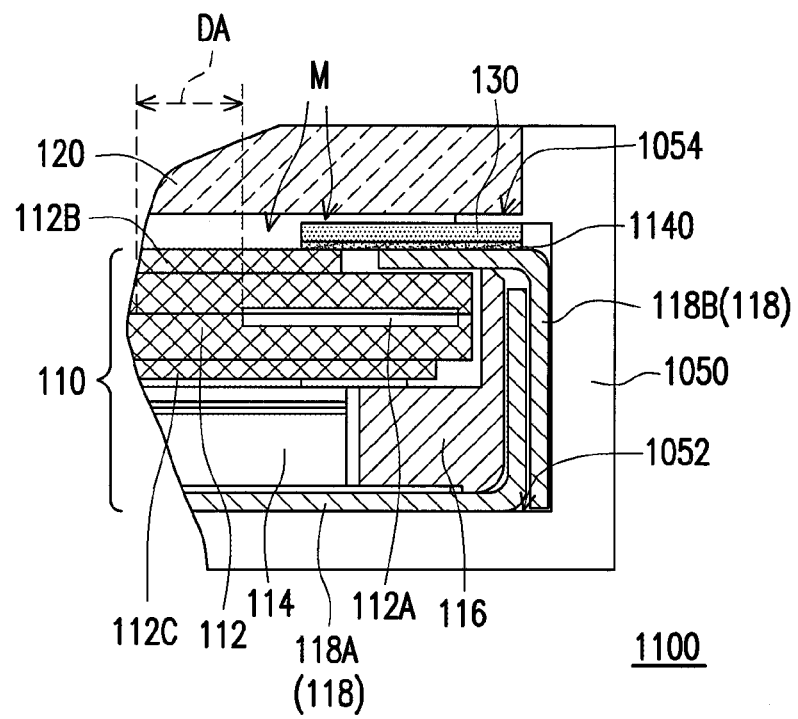
FIG. 11 is a schematic view illustrating a display device according to an eleventh embodiment of the invention.

FIG. 11 is a schematic view illustrating a display device according to an eleventh embodiment of the invention. With reference to FIG. 11, the components of the display device 1100 are similar to those of the display device 1000 described in the tenth embodiment, while the adhesive 1140 in the display device 1100 is configured on the display module 110, such that the light shielding film 130 is fixed to the display module 110 by the adhesive 1140 and located between the display module 110 and the housing 1050. That is to say, in this embodiment, the light shielding film 130 is not only fixed to the display module 110 by the adhesive 1140 but also sandwiched between the second accommodation part 1054 and the display module 110, such that the light shielding film 130 is well fixed. Meanwhile, the cover plate 120 configured on the second accommodation part 1054 can also be well fixed and aligned by the second accommodation part 1054, so as to reduce the amount of the required adhesive 1140 between the cover plate 120 and the light shielding film 130. As such, the air bubbles are less likely to be generated between the cover plate 120 and the light shielding film 130, and then the display quality of the display device 1100 can be improved. The same inter-medium M (e.g., air) is configured between the cover plate 120 and the light shielding film 130 and between the cover plate 120 and the display module 110, such that the users are less likely to observe the boundary between two areas when the users view the image displayed on the display device 1100 at oblique angles.

Figure 12:
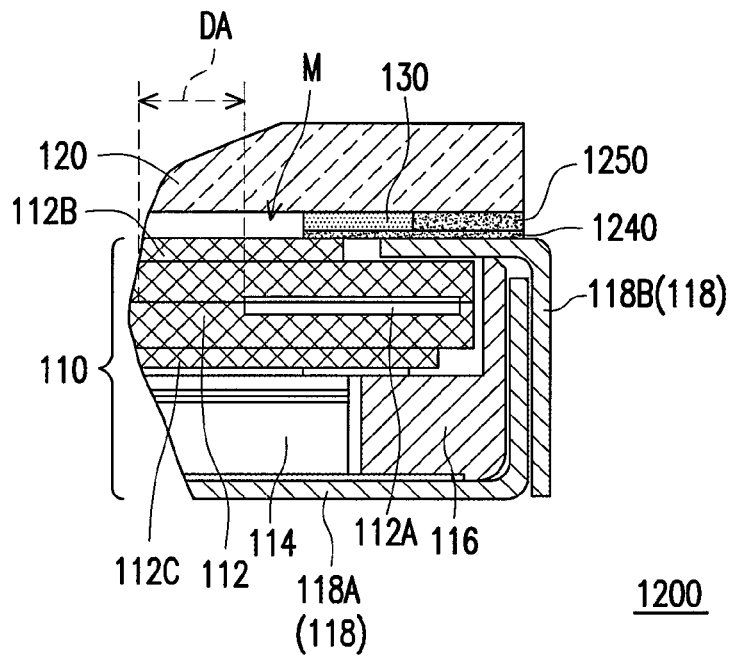
FIG. 12 is a schematic view illustrating a display device according to a twelfth embodiment of the invention.

In the above-mentioned embodiments, space exists between the light shielding film 130 and the cover plate 120, which should not be construed as a limitation to the invention. FIG. 12 is a schematic view illustrating a display device according to a twelfth embodiment of the invention. With reference to FIG. 12, a display device 1200 includes a display module 110, a cover plate 120, and a light shielding film 130. The display module 110 of this embodiment is substantially the same as the display module 110 described in the first embodiment. One of the differences between this embodiment and the first embodiment lies in that the light shielding film 130 is in contact with the cover plate 120 and is located between the cover plate 120 and the display module 110.

Additionally, in this embodiment, the light shielding film 130 is fixed to the display module 110 by a first adhesive 1240 and a second adhesive 1250, for instance. The first adhesive 1240 is configured between the light shielding film 130 and the display module 110, such that the light shielding film 130 is adhered to the display module 110 by the first adhesive 1240. The second adhesive 1250 is located on one side of the light shielding film 130 away from the display area DA and located between the cover plate 120 and the first adhesive 1240, such that the first adhesive 1240 is adhered to the cover plate 120 by the second adhesive 1250. In the meantime, the cover plate 120 can be fixed to the display module 110.

In this embodiment, no component is configured between the cover plate 120 and the light shielding film 130, such that the light shielding film 130 is in direct contact with the cover plate 120. As such, no air bubbles exist between the cover plate 120 and the light shielding film 130, and thus the display effects of the display device 1200 are not affected by the air bubbles. According to an embodiment of the invention, the second adhesive 1250 can be an elastic adhesive, such that the adhesion between the cover plate 120 and the light shielding film 130 can be controlled by the elastic second adhesive 1250 during the assembling process regardless of the thickness of the second adhesive 1250. In FIG. 12, there is no space between the cover plate 120 and the light shielding film 130, which should however not be construed as a limitation to the invention. It is possible to configure the same inter-medium between the cover plate 120 and the light shielding film 130 and between the cover plate 120 and the display module 110 in this embodiment. Meanwhile, the cover plate 120 and the display module 110 can be adhered to each other by the first adhesive 1240 and the second adhesive 1250, and the light shielding film 130 can be well fixed between the cover plate 120 and the display module 110.

In light of the foregoing, an opaque thin film serving as the light shielding film is configured in the display device of the invention. The light shielding film is located outside the display area of the display panel in the invention, so as to block the peripheral light leakage. Hence, the users can enjoy the display images with favorable display quality instead of observing the peripheral light leakage when the users view the images displayed on the display device at large viewing angles. Moreover, the air bubbles are not apt to be generated between the light shielding film and the outermost cover plate in the invention, and therefore the users do not observe the light refracted by the air bubbles when viewing the images displayed on the display device. As a result, the display device of the invention can have favorable display quality.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display device comprising:
   a display module comprising a display panel, the display panel having a black matrix pattern, the black matrix pattern surrounding a display area;
   a cover plate configured on the display module; and
   a light shielding film located between the display module and the cover plate, the light shielding film being substantially located outside the display area, wherein an inter-medium is configured between the light shielding film and the cover plate and between the display module and the cover plate.

2. The display device as claimed in claim 1, wherein the inter-medium is air.

3. The display device as claimed in claim 2, further comprising an adhesive located between the light shielding film and the cover plate and configured at a portion of the light shielding film away from the display area.

4. The display device as claimed in claim 3, wherein the adhesive is further configured between the light shielding film and the display module, and the light shielding film is fully or partially coated with the adhesive.

5. The display device as claimed in claim 1, wherein an area of the cover plate is greater than an area of the display module.

6. The display device as claimed in claim 1, wherein the display module further comprises a frame, and the display panel is configured in the frame.

7. The display device as claimed in claim 6, wherein the light shielding film is adhered to the display panel and the frame.

8. The display device as claimed in claim 1, wherein the inter-medium is an optical adhesive, and the light shielding film is adhered to the cover plate by the optical adhesive.

9. The display device as claimed in claim 8, further comprising an adhesive configured between the display module and the light shielding film to fix the light shielding film to the display module.

10. The display device as claimed in claim 1, further comprising a housing having a first accommodation part and a second accommodation part, the display module being placed in the first accommodation part, the cover plate being placed on the second accommodation part.

11. The display device as claimed in claim 10, wherein the light shielding film is adhered to one of the cover plate and the display module.

12. The display device as claimed in claim 1, wherein a material of the light shielding film comprises polyethylene terephthalate.

13. The display device as claimed in claim 1, wherein the cover plate is a touch-sensing panel.

* * * * *